United States Patent [19]
Cook et al.

[11] Patent Number: 5,304,921
[45] Date of Patent: Apr. 19, 1994

[54] ENHANCED GROUNDING SYSTEM FOR SHORT-WIRE LENGTHED FIXTURE

[75] Inventors: Stephen J. Cook; Ronald K. Kerschner, both of Loveland, Colo.

[73] Assignee: Hewlett-Packard Company, Palo Alto, Calif.

[21] Appl. No.: 741,719

[22] Filed: Aug. 7, 1991

[51] Int. Cl.⁵ .................. G01R 31/02; G01R 1/06
[52] U.S. Cl. ........................ 324/158 F; 324/158 P
[58] Field of Search ............ 324/158 P, 158 F, 72.5; 439/482, 842; 333/246, 248

[56] References Cited

U.S. PATENT DOCUMENTS

| | | | |
|---|---|---|---|
| 3,911,361 | 10/1975 | Bove et al. | 324/158 P |
| 3,963,986 | 6/1976 | Morton et al. | 324/158 F |
| 4,419,626 | 12/1983 | Cedrone et al. | 324/158 P |
| 4,544,888 | 10/1985 | Kvaternik | 324/158 F |
| 4,616,178 | 10/1986 | Thornton, Jr. et al. | 324/158 |
| 4,712,062 | 12/1987 | Takamine | 324/158 F |
| 4,731,577 | 3/1988 | Logan | 324/158 F |
| 4,739,259 | 4/1988 | Hadwin et al. | 324/158 P |
| 4,740,746 | 4/1988 | Pollock et al. | 324/158 F |
| 4,795,977 | 1/1989 | Frost et al. | 324/158 F |
| 4,799,007 | 1/1989 | Cook et al. | 324/158 |
| 4,894,612 | 1/1990 | Drake et al. | 324/158 |
| 4,912,401 | 3/1990 | Nady, III et al. | 324/158 F |
| 4,973,256 | 11/1990 | Petry | 324/158 F |
| 4,996,478 | 2/1991 | Pope | 324/158 P |
| 5,014,002 | 7/1991 | Wiscombe et al. | 324/158 F |
| 5,041,782 | 8/1991 | Marzan | 324/158 F |
| 5,066,907 | 11/1991 | Tarzwell et al. | 324/158 F |
| 5,068,602 | 11/1991 | Mielke | 324/158 R |

*Primary Examiner*—Vinh Nguyen

[57] ABSTRACT

Grounding technology is provided for a short-wire, circuit board test fixture. As a result of the grounding technology, the ground between a circuit board test system and a circuit board under test can be reliably controlled. The grounding technology provides testing at extremely higher speeds by minimizing ground bounce. An internal ground plane is situated in the test fixture. Pursuant to one embodiment of the invention, a coax assembly at ground potential surrounds critical signal paths between the internal ground plane and an alignment plate situated at the bottom of the test fixture. Either a conductive alignment plate or a conductive ground comb affixed to a non-conductive alignment plate is implemented to permit conduction of the ground signal between the board test system and the coax assembly. In another embodiment, an array of ground personality pins provides conduction of the ground signal between the internal ground plane and the board test system. The ground personality pins are clustered around critical signal paths to control impedance.

20 Claims, 6 Drawing Sheets

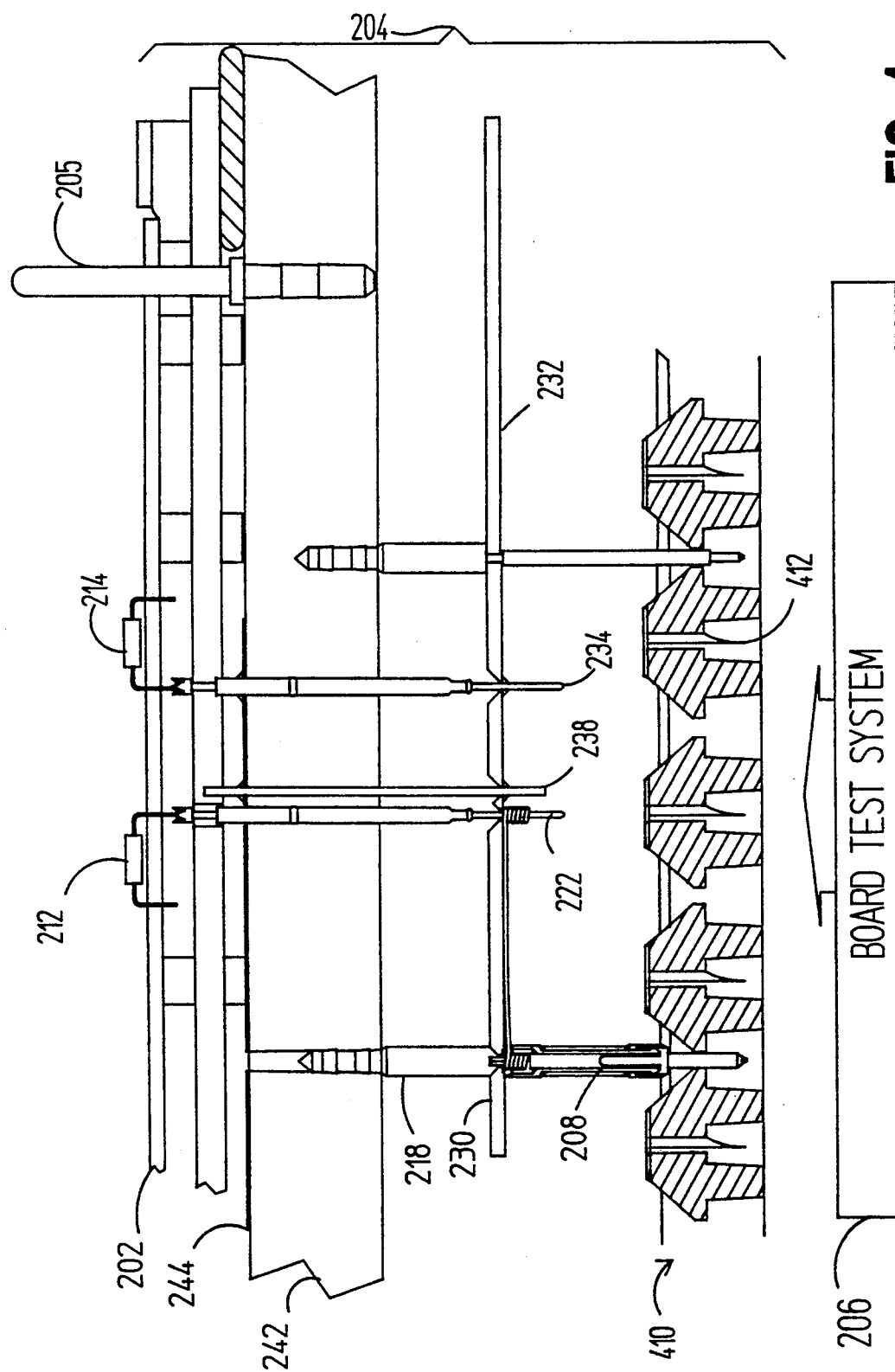

ENHANCED GROUNDING SYSTEM FOR SHORT-WIRE LENGTHED FIXTURE

BACKGROUND OF THE INVENTION

I. Field of the Invention

The present invention generally relates to the testing of electronic circuit boards and, more particularly, to board test fixtures and other mechanical interfaces for electrically interconnecting electronic circuit boards and the like to electrical test systems.

II. Related Art

A board test system consists of numerous electronic drivers (sources) and receivers (detectors) which are connected through an electronic switching mechanism, or scanner, to a plurality of contact points referred to as scanner pins. A board test fixture then provides an interface between these scanner pins and the electronic components located on an electronic circuit board. Because the electronic test signals which are used to determine whether the electronic component is operating properly must pass through the board test fixture both on their way to and from the electronic component, the board test fixture must maintain the signal quality of the test signals to ensure that the electronic component is not incorrectly diagnosed as operating either properly or improperly.

It has been recognized in the art that in order to ensure maximum test signal quality, the length of the signal path between the scanner and the electronic circuit board must be kept as short as possible. This factor normally dictates a short vertical coupling of the test system and the circuit board. In other words, a "short-wire" board test fixture is designed to sit directly on top of the scanner and the electronic circuit board directly on the board test fixture. Furthermore, any board test fixture must be easy to assemble and maintain in order to be readily usable and cost effective. Finally, the ability to automate the assembly of the fixture is also an important feature.

U.S. Pat. No. 4,799,007 to Cook et al., which is incorporated herein by reference, describes a board test fixture which provides short and reliable connections between a test system and a circuit board under test. The foregoing short-wire fixture provides for good signal fidelity with digital signals up to approximately 6 megahertz (MHz). However, due to electrical parasitics, signal fidelity begins to fall off above about 6 MHz, and the ability to accurately test can become difficult above around 12 MHz.

Thee electrical parasitics phenomenon is discussed with reference to FIG. 1. Electrical parasitics are also known in the art as ground bounce or voltage/current spikes. Ground bounce is often caused by the quick transitioning of the outputs of the circuit board under test. As shown in FIG. 1 at reference 102, the various outputs of the circuit board under test are connected to the receivers of the test system via the board test fixture. Furthermore, as shown at reference 104, the inputs of the board under test are connected to driver outputs of the test system via the board test fixture. The board test fixture comprises wiring which is schematically shown in FIG. 1 as inductances $L_r$, $L_g$, $L_d$.

Now, in operation, when a circuit board output 106 switches, the receiver input current $I_r$ must pass through the fixture wiring to charge the input capacitance $C_r$ of the receiver 108. The capacitance $C_r$ comprises the actual receiver input capacitance in combination with the board trace capacitance. The magnitude of the charging current $I_r$ can be predicted from the following formula: $I_r = C_r \ast (dV_r/dt)$. Because the capacitance $C_r$ is largely fixed in the board test system, the primary determining factor in the magnitude of the current $I_r$ the switching speed of the board output.

The current $I_r$ which flows from the board output to the test system must in some way return to the circuit board under test by some electrical path in order to satisfy Kirchoff's current laws. While a small part of the current $I_r$ may be returned by other paths, the majority of it will flow through the fixture ground wires, as indicated by reference 110 as a current $L_g$.

The ground current $I_g$ flowing through the fixture ground wiring will induce a voltage $V_g$ across the wire inductance $L_g$, wherein $V_g = L_g \ast (dI_g/dt)$. As indicated by the foregoing equation, the switching speed of the circuit board under test affects the voltage $V_g$ across the wire inductance $L_g$. In other words, the induced voltage $V_g$ appears between the circuit board ground and the test system ground, as shown.

A voltage difference between the two grounds, i.e., or ground bounce, has extreme adverse effects as described hereafter. The output voltage of the driver 112 is maintained at a constant level with respect to the test system ground (assuming that the driver 112 is not switching). The board inputs of the circuit board 114 exhibit very high impedance, so very little current $I_d$ will flow through the fixture wiring having inductance $L_d$. Thus, because the current $I_d$ minimal, very little voltage $V_d$ developed across the fixture wiring, pursuant to the aforementioned inductance equation. Moreover, the board input voltage will follow the driver output voltage, resulting in $V_g$ being impressed on the board input. When the ground bounce voltage is impressed on the board input, there is a risk of causing the input voltage to cross the logic threshold associated with the board input.

In the case of purely combinational logic circuit, the ground bounce predicament is not a severe risk, because a waiting period can be implemented to settle out the adverse effects. However, in the case of a sequential logic circuit for which this input is a clock or other state determining element, the state of the circuit is changed, and the test will fail no matter how slowly the test is advanced.

To insure signal integrity at high speeds through the short-wire fixture, several approaches can be taken. First, the line inductance $L_r$ can be increased. This can be accomplished, for example, by adding a ferrite bead to the fixture wires. The added inductance in the receiver path 102 helps to dampen the ground bounce by limiting the rise time of the current $I_r$. Second, the capacitance at the circuit board input can be increased. This can be accomplished, for example, by adding a small capacitor to the fixture wires between the circuit board input line and a circuit board ground line. The added capacitance in the drive path 104 helps to dampen the ground bounce by limiting the rise time of the signal at the circuit board input. Moreover, the increased capacitance can be combined with an increase in the inductance $L_d$ for a more pronounced effect. A third approach is to reduce the ground inductance $L_g$ by adding more ground wires and keeping them short.

However, all of the foregoing approaches are problematic. The first and second approaches are undesirable because the low pass filter nature of these approaches adversely distorts the test signal itself in an effort to control test signal transients causing ground bounce. Furthermore, the third approach is somewhat limited because of the limited number of ground probe locations on the circuit board, the limited number of per-ground pin connections within the test system, and limited space in the board test fixture.

SUMMARY OF THE INVENTION

The present invention is a ground system and method for a short-wire test fixture to be situated between a board test system and a circuit board under test. The ground system minimizes ground bounce so that the fixture can be used at very high speeds.

In the ground system, the test fixture is equipped with an internal ground plane interposed somewhere between the circuit board and the board test system. Furthermore, in one embodiment of the ground system, a coax assembly at ground potential surrounds each critical signal path between the internal ground plane and the board test system. A critical signal path is any signal path carrying a fast-switching signal which may cause ground bounce.

In another embodiment of the present invention, an array of ground personality pins is distributed between the internal ground plane and the board test system. The ground personality pins are maintained at ground potential by the board test system and are situated close to personality pins carrying critical signals.

The present invention overcomes the deficiencies of the prior art and further provides for the following additional features and advantages.

The present invention provides a complete distributed ground system through the board test fixture and down into the circuit board under test.

Very high speed testing is permitted by eliminating any ground bounce. Signal fidelity through the board test fixture is adequate for test frequencies of over 50 MHz.

The present invention can be implemented in the architecture disclosed in U.S. Pat. No. 4,799,007 to Cook et. al. It does not require a change to the architecture, does not require twisted pair wiring, and provides a lower impedance path for signals in the short-wire single fixture.

In accordance with the present invention, interconnection pins, or personality pins, are allowed to bend around conflicting board test probes.

Further features and advantages of the present invention will become apparent to one skilled in the art upon examination of the following drawings and the detailed description. It is intended that any additional features and advantages be incorporated herein.

BRIEF DESCRIPTION OF THE DRAWINGS

The present invention, as defined in the claims, can be better understood with reference to the text and to the following drawings. The drawings are not necessarily to scale, emphasis being placed instead on clearly illustrating principles of the present invention.

FIG. 4 illustrates a second embodiment of the present invention wherein the ground system uses a ground comb and a coax assembly.

DETAILED DESCRIPTION OF THE PREFERRED EMBODIMENTS

Figure 1:
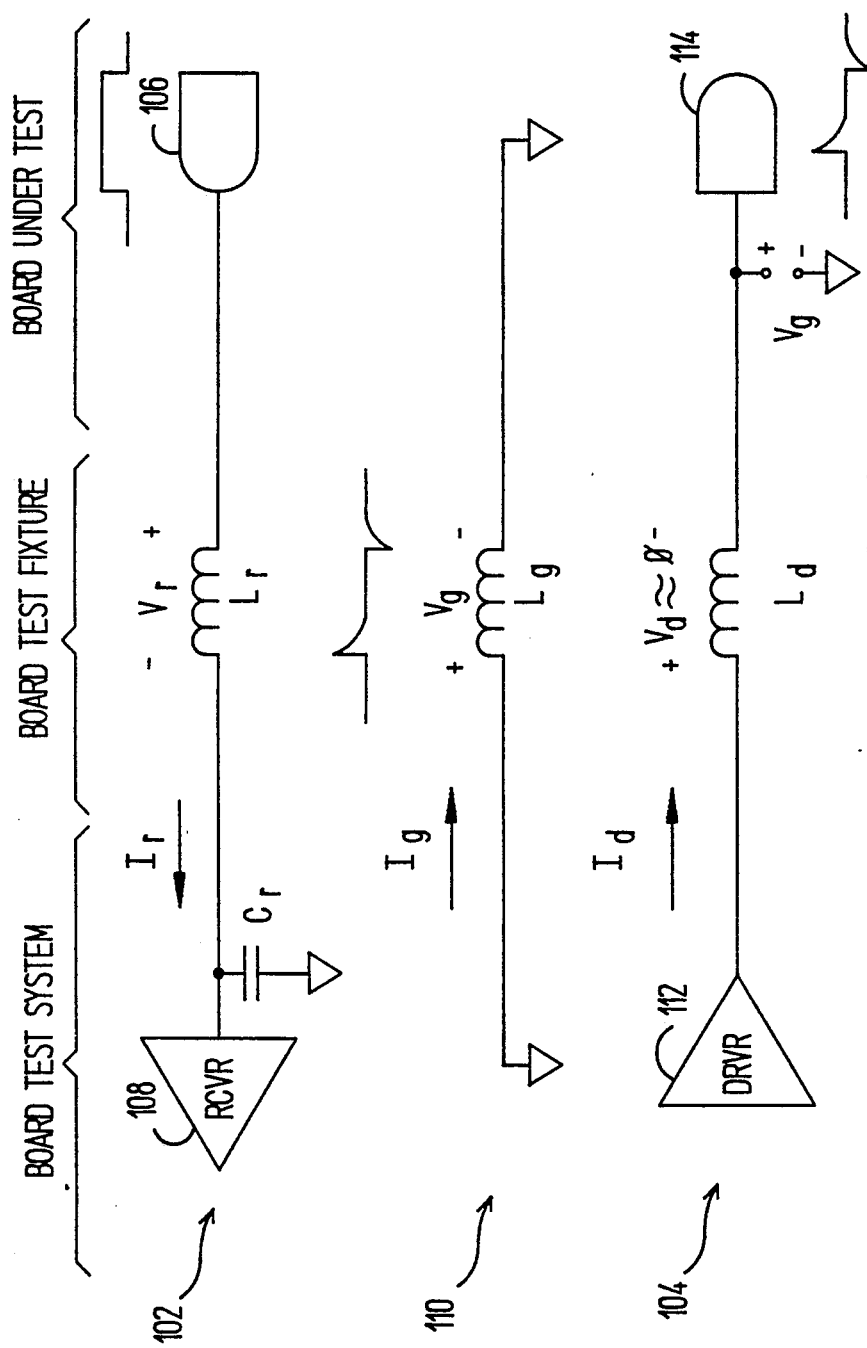
FIG. 1 illustrates the electrical ground bounce problem solved by the present invention.
Figure 2:
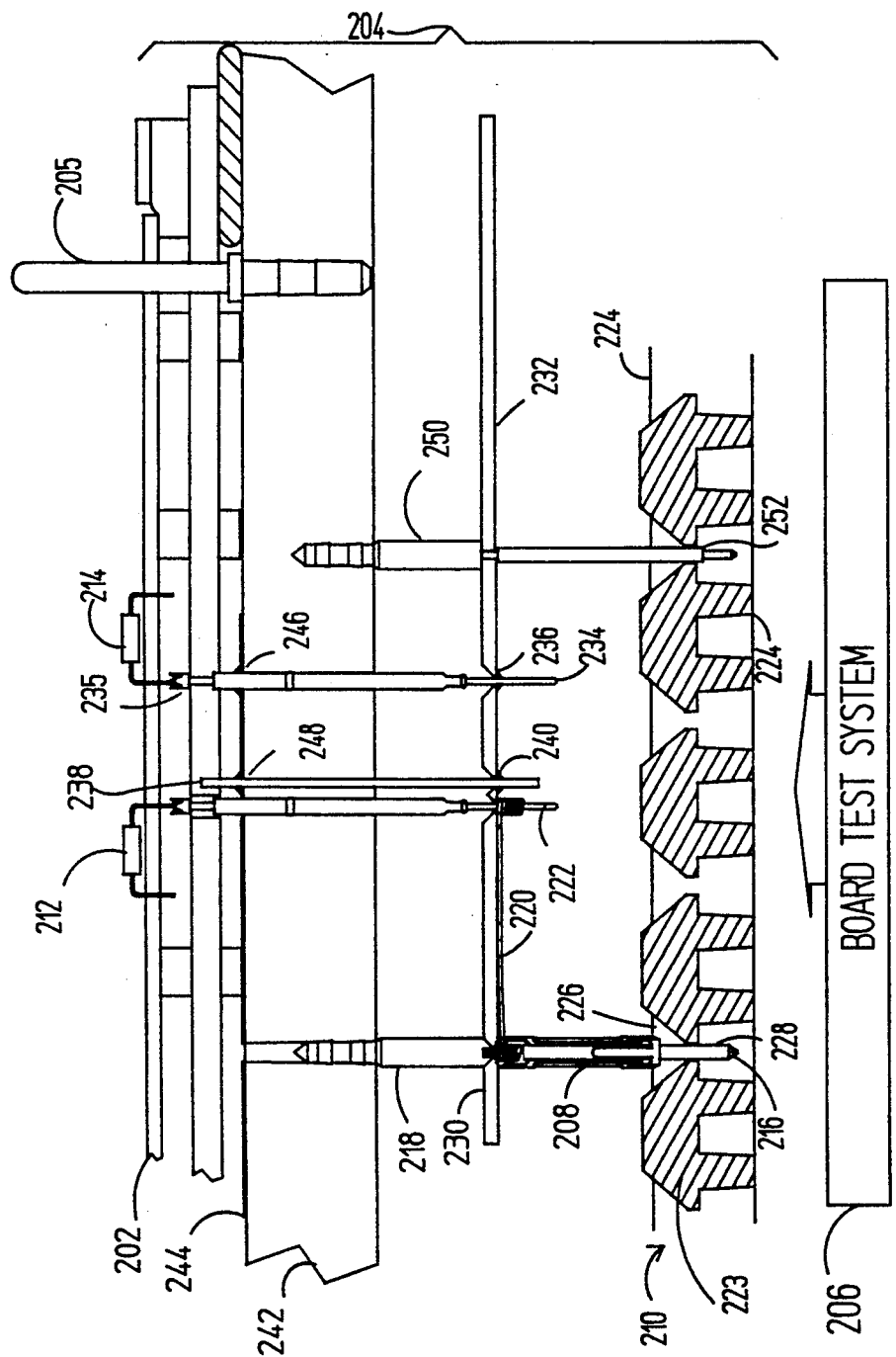
FIG. 2 shows a first embodiment of the present invention wherein a ground system uses a plated alignment plate and a coax assembly.

Many embodiments for implementing a grounding system in accordance with of the present invention are envisioned. FIG. 2 shows a system wherein a first preferred embodiment of the present invention is implemented.

As shown in FIG. 2, a circuit board 202 to be tested is placed on top of a board test fixture 204 via the guidance of an alignment pin 205. The board test fixture 204 provides an electrical interface between the circuit board 202 and the board test system 206. In other words, many test signals travel through the board test fixture 204.

The present invention envisions implementing a grounding system which utilizes ground coax assemblies 208 and a plated alignment plate 210 in the board test fixture 204, as are described in detail below. The grounding system permits testing of the circuit board 202 at very high speeds.

Various test signal paths travel from the board test system 206 through the board test fixture 204 to electronic components 212,214 on a circuit board 202 under test. As shown in FIG. 2, for example, a test signal from the board test system 206 travels through the wire-wrapping pin 216 of a personality pin 218, through a wire 220, and then through a signal probe 222, respectively, before reaching the electronic component 212. The location of the personality pins and the signal probes as well as the length of their connecting wires changes depending upon the orientation of electronic components 212,214 on the circuit board 202 under test.

Various ground paths also travel through the board test fixture 204 between the circuit board 202 under test and the board test system 206. Ground connectors from the board test system 206 contact the bottom of the board test fixture 204 in order to make the ground path available to the fixture 204.

At the bottom of the fixture 204 is the alignment plate 210, which serves as a focus means to capture and guide personality pins 218, which carry test signals, into an organized orthogonal array-like pattern when the alignment plate 210 is installed so that the board test system 206 can send test signals through the fixture 204.

However, the alignment plate 210 further serves as a ground conductance means. It comprises an inner nonconductive support material 223 and a conductive outer plating 224 on all of its exposed surface areas, including the top, bottom, and through-ways. The plating 224 is preferably a metal. In the preferred embodiments, the metal is a combination of copper and nickel or a combination of copper, nickel, and gold, in order to provide an excellent transitional ground path from the board test system 206 to the top 226 of the alignment plate 210. The plated alignment plate 210 provides a good impedance control because it positions the ground path near the signal paths.

In order to provide the ground path from the top 226 of the alignment plate 210 upward through the board test fixture 204 while maintaining the ground near the signal paths, the coax assembly 208 is positioned concentrically around each signal path, specifically each personality pin, which carries a signal posing a potential ground bounce problem. Such signal paths are called "critical" signal paths. The critical signal paths are usually those paths which carry electrical signals which switch at a high speed.

Figure 3A:
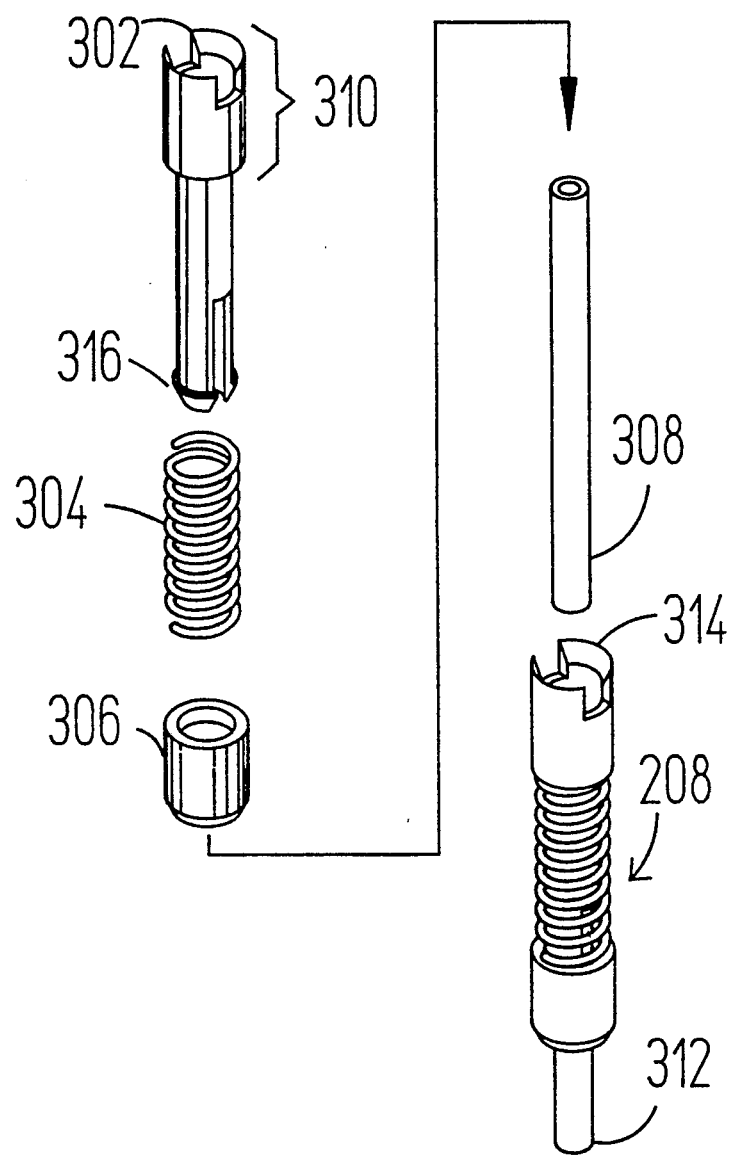
FIGS. 3a-3b show a coax assembly for personality pins.
Figure 3B:
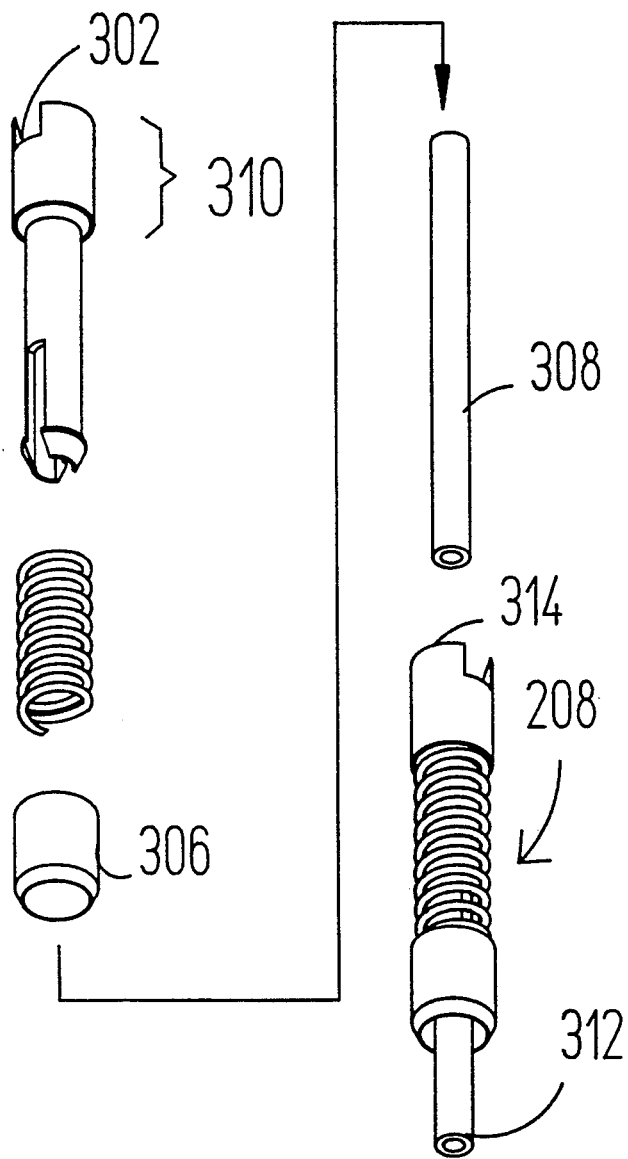

The ground signal carried by the coax assembly 208 is isolated from the internal wire-wrap pin 216 via a piece of plastic tubing 228. As shown in FIG. 2, the plastic tubing 228 extends from the wire wrap at the base of the wire-wrap pin 216 to just short of the tip of the pin 216. The plastic tubing 228 extends down through the plated alignment plate 210 in order to prevent the pin 216 from contacting the plating 224, thereby tainting the test signal on pin 216. FIGS. 3(a) and 3(b) show in detail the ground coax assembly 208.

As shown in FIGS. 3(a) and 3(b), the ground coax assembly comprises a conductive, internal coax sleeve 302, a spring 304, a conductive, external coax sleeve 306, and a plastic insulator 308. The sleeve 302 is notched, as shown, so as to permit access of The signal wire 220 to the enclosed personality pin. The wire wrap would be enclosed by the enlarged region 310. Further, the bottom part 312 and the top part 314 of the coax assembly 208 are forced apart by the compression spring 304. A stop 316 is designed to catch the external coax sleeve 306 to prevent the coax assembly 208 from coming completely apart.

With reference again to FIG. 2, the top part 314 of the coax assembly 208, which has sharp edges, is pressed against an internal ground plane 230 mounted inside the board test fixture 204 by the spring 304. The bottom part 312 of the coax assembly 208 is forced by the spring 304 against the metal plating 224 of the alignment plate 210 described above. The internal ground plane 230 has plating 232 at its underside only and is located near the base of the wire-wrap pin 216.

The signal wire 220, which passes between the notch at the upper part 314 of the coax assembly 212, is routed in very close proximity to the internal ground plane 230 in order to provide strip line impedance control for the critical signal wire. It should be noted that once the wire 220 leaves the plating 232 of the internal ground plane 230 by more than ½ a wire diameter, or so, the impedance adversely rises quickly.

From the plating 232, the ground signal is provided to the circuit board 202 via the various ground probes and various ground pins which are soldered to the plating 232. As illustrated in FIG. 2, a ground probe 234 is soldered to the plating 232 at a point 236. Moreover, a small ground pin 238 is soldered to the plating 232 at a soldering point 240. Both the ground probe 234 and the ground pin 238 carry the ground signal through a probe plate 242 to an external ground plane 244, which is optional. As shown, the ground probe 234 and the ground pin 238 are soldered to the external ground plane 244 at respective soldering points 246 and 248. Further note that, unlike the ground pin 238, the ground probe 234 extends further upward in order to contact the ground on the electronic component 214 in a direct manner to make an electrical contact, as shown at reference number 235.

Care is taken so that the small ground pin 238 is associated in close proximity to the signal probe 222. This close association helps substantially in controlling impedance. A number of small ground pins could be clustered around a critical signal path if warranted.

Worth noting is that if a high degree of impedance control is not required in the test fixture 204, the external ground plane 244 and the array of small ground pins, such as the ground pin 238, may be conveniently eliminated from the structure. Such a simplified fixture would be cheaper and much easier to construct.

Finally, for those personality pins which do not have a corresponding coax assembly 208, an insulator, such as for example the plastic insulator 308, is provided to surround the corresponding wire-wrap pin so that it does not contact the plating 224 on the alignment plate 210. As shown in FIG. 2, the personality pin 250 is concentrically surrounded along its axis by an insulator 252.

FIG. 4 illustrates a second preferred embodiment of the present invention. The second preferred embodiment is similar to the first preferred embodiment of FIG. 2 in many respects. However, the alignment plate 410 of FIG. 4 does not comprise a conductive outer plating, as does the alignment plate 210 of FIG. 2.

Instead, the alignment plate 410 comprises a ground comb 412, which is a sheet metal part placed, bonded, or affixed in some fashion, onto the alignment plate 410. In the preferred embodiment, the ground comb 412 is affixed to the alignment plate 410 via a snap-fit arrangement. In the snap-fit arrangement, the ground comb 412 comprises one or more protruding parts which snap into the alignment plate 410 to thereby hold the ground comb 412 contiguous to the alignment plate 410.

Essentially, the ground comb 412 communicates the ground from the board test system 206 through the alignment plate 410 to any coax assemblies 208. It should be noted that the plated alignment plate 210 of FIG. 2 provides slightly better impedance control than the combination of the ground comb 412 and alignment plate 410 of FIG. 4 because it generally provides a ground path more closely coupled to the signal paths. However, the plated alignment plate technique is more expensive than the ground comb technique. Consequently, a cost versus performance analysis must be performed in order to select the best option for a particular embodiment.

Figure 5:
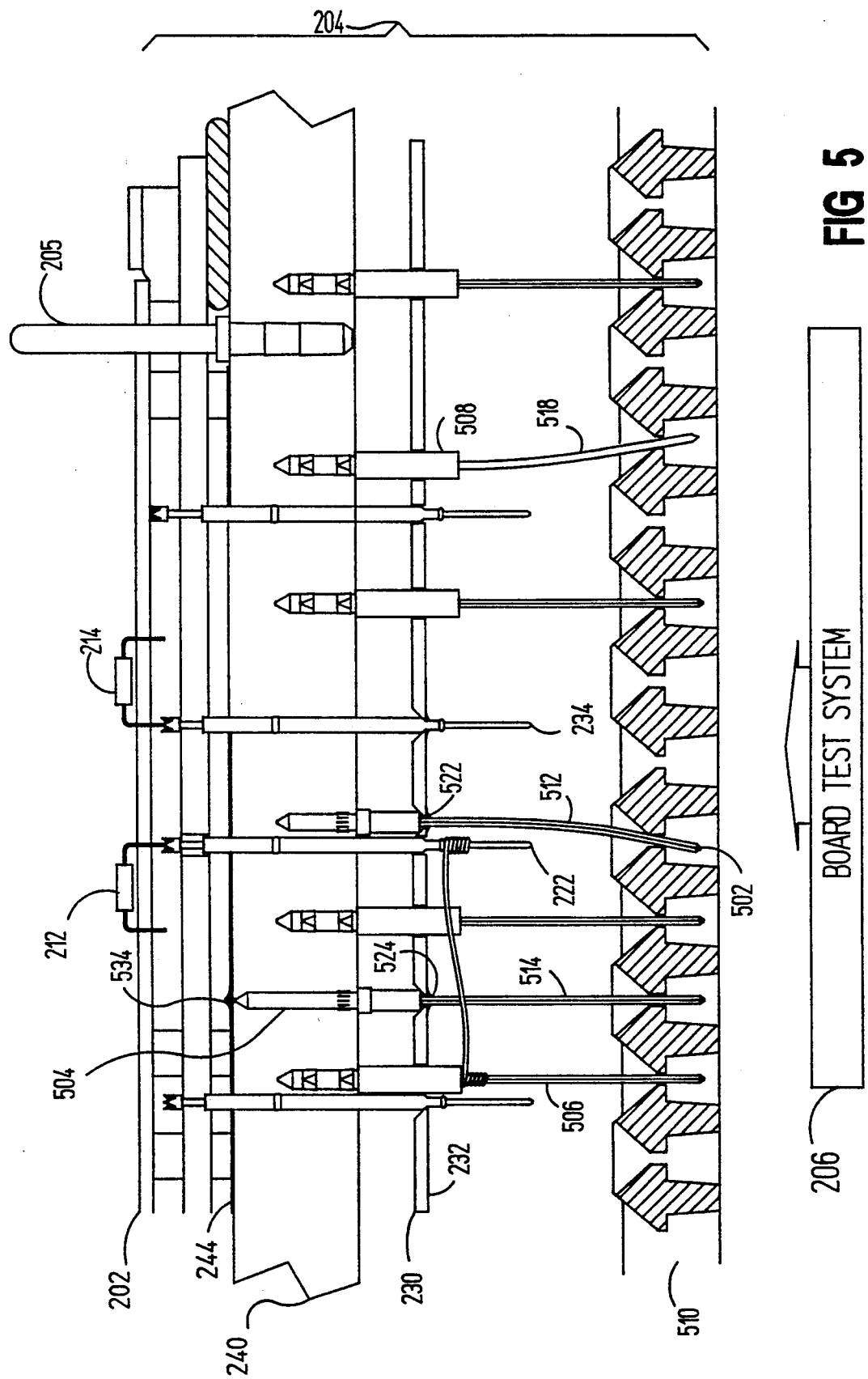
FIG. 5 illustrates a third embodiment of the present invention wherein the ground system uses ground personality pins.

FIG. 5 shows a third preferred embodiment of the present invention wherein an array of ground personality pins 502,504 are implemented in order to control impedance through the board test fixture 204. The array of ground personality pins 502,504 are intermixed among the array of test signal personality pins 506. The ground personality pins 502,504 can be clustered, if desired, around critical signal paths to more efficiently control impedance.

The ground personality pins 502,504 are mounted in the probe plate 240 and their wire-wrap pins 512,514 are then soldered to the internal ground plane 230, as indicated at reference numerals 522,524. The ground personality pins 502,504 are made available to the board test system 206 via an alignment plate 504.

The alignment plate 510 is essentially composed of a non-conductive plastic material. The alignment plate 510 essentially serves as a focus means to capture and guide both the ground personality pins 502,504 and the test signal personality pins 506 into an organized orthogonal array-like pattern when the alignment plate 510 is installed, so that the board test system 206 has easy access to both types of pins at the bottom of the board test fixture 204.

To this end, the ground personality pins 502,504 as well as the test signal personality pins 506,508 may bend, as shown by respective wire-wrap pins 512,518 in order to pass through the alignment plate 510 to the board test system 206.

In accordance with another aspect of the present invention, the metal bodies of the ground personality pins 502,504 may extend out past the top of the probe plate 240, where their top ends may be soldered to the external ground plane 244, thus further controlling impedance. FIG. 5 illustrates the ground personality pin 504 with its metal body extended and soldered to the external ground plane 244, as indicated by reference numeral 534. As with the other preferred embodiments, it should be emphasized that the external ground plane 244 is an optional feature of the present invention. If the external ground plane 244 is not needed, the bodies of the ground personality pins 502,504 need only be long enough to press into the probe plate 240. Needless to say, in this case, the bodies of the ground personality pins 502,504 need not be conductive.

The holes in the internal ground plane 230 for the ground personality pins 502,504 can be sized in order to allow soldering to the internal ground plane 230. If too much hole clearance exists, soldering can be difficult. In contrast, clearance for test signal personality pins 512 need to be great enough to guarantee that the pins 512 will not accidentally touch the plating 232 of the internal ground plane 230. Furthermore, in order to help capture all of the ground personality pins 502,504 at once when the internal ground plane 230 is installed, the small clearance holes in the internal ground plane 220 should be countersunk, as shown.

The foregoing description of the preferred embodiments of the present invention has been presented for purposes of illustration and description. It is not intended to be exhaustive or to limit the present invention to the precise forms disclosed, and obviously many modifications and variations are possible in light of the above teachings.

The preferred embodiments were chosen and described in order to best explain the principles of the present invention and its practical application to those persons skilled in the art and to thereby enable those persons skilled in the art to best utilize the present invention in various embodiments and with various modifications as are suited to the particular use contemplated. It is intended that the scope of the present invention be broadly defined by the following claims.

We claim:

1. A ground system in a test fixture for minimizing ground bounce between a board test system and a circuit board under test, comprising:
    a probe plate located in the test fixture;
    alignment means located in the test fixture and spaced apart from said probe plate, said alignment means having a conductive surface which is electrically connectable to ground potential;
    an internal ground plane located in the test fixture and interposed between said probe plate and said alignment means, said internal ground plane having a conductive surface facing the conductive surface of said alignment means;
    at least one signal pin extending from said internal ground plane through said probe plate and electrically connectable with an electronic component mounted on the circuit board under test;
    at least one coax assembly extending between said alignment means and said internal ground plane, the coax assembly having an outer conductor electrically connected to the conductive surfaces of said internal ground plane and said alignment means, and an internal conductor electrically isolated from said external conductor and from said conductive surface of said alignment means and said internal ground plane, said internal conductor being electrically connected to said signal pin and to the board test system; and
    at least one ground pin extending from said internal ground plane through said probe plate, said ground pin being electrically connected to the conductive surface of said internal ground plane and electrically connectable to the ground of the electronic component mounted on the circuit board under test.

2. A ground system according to claim 1, further comprising:
    an external ground plane formed on a surface of said probe plate; and
    at least one further ground pin extending between said probe plate and said internal ground plane and electrically connected to each of said internal and external ground planes.

3. A ground system according to claim 2, wherein said ground pin that is electrically connectable to the electronic component is electrically connected to said external ground plane.

4. A ground system according to claim 2, further comprising a plurality of further ground pins substantially surrounding each said signal pin in the space between said internal ground plane and said probe plate.

5. A ground system according to claim 1, wherein the electrical connection between the internal conductor of said coax assembly and said signal pin comprises a signal wire disposed adjacent to but spaced apart from the conductive surface of said internal ground plane.

6. A ground system according to claim 5, wherein said signal wire is spaced apart from the conductive surface of said internal ground plane by not more than about $\frac{1}{4}$ wire diameter to provide strip line impedance for the signal wire.

7. A ground system according to claim 1, wherein said alignment plate comprises an internal non-conductive support having an external conductive metal surface coating thereon to permit conduction of the ground signal between the test board system and said coax assembly.

8. A ground system according to claim 1, wherein said alignment plate comprises an internal non-conductive support having a ground comb fixed thereon to permit conduction of the ground signal between the test board system and said coax assembly.

9. A ground system according to claim 1, wherein said coax assembly comprises a conductive cylinder-like sleeve having a narrow part and a wide part, a conductive ring placed over said narrow part, a plastic cylinder-like insulator concentrically surrounding said internal conductor, and a spring disposed between said ring and said wide part for forcing said sleeve to contact the conductive surface of said internal ground plane and said ring to contact the conductive surface of said alignment means.

10. A ground system according to claim 9, wherein said wide part contains an opening to provide a path for the electrical connection between the internal conductor of said coax assembly and said signal pin.

11. A ground system in a test fixture for minimizing ground bounce between a board test system and a circuit board under test, comprising:
  a probe plate located in the test fixture;
  alignment means located in the test fixture and spaced apart from said probe plate, said alignment means having a conductive surface which is electrically connectable to ground potential;
  an internal ground plane located in the test fixture and interposed between said probe plate and said alignment means, said internal ground plane having a conductive surface facing the conductive surface of said alignment means;
  a plurality of signal pins extending from said internal ground plane through said probe plate and electrically connectable with one or more electronic components mounted on the circuit board under test;
  a plurality of coax assemblies extending between said alignment means and said internal ground plane, each coax assembly having an outer conductor electrically connected to the conductive surfaces of said internal ground plane and said alignment means, and an internal conductor electrically isolated from said external conductor and from said conductive surface of said alignment means and said internal ground plane, said internal conductors being electrically connected to corresponding ones of said signal pins and to the board test system; and
  a plurality of ground pins extending from said internal ground plane through said probe plate, said ground pins being electronically connected to the conductive surface of said internal ground plane and electrically connectable to the grounds of the electronic components mounted on the circuit board under test.

12. A ground system according to claim 11, further comprising:
  an external ground plane formed on a surface of said probe plate; and
  a plurality of further ground pins extending between said probe plate and said internal ground plane and electrically connected to each of said internal and external ground planes, at least one further ground pin being disposed adjacent to a corresponding one of said signal pins.

13. A ground system according to claim 12, wherein said ground pins that are electrically connectable to the electronic components are electrically connected to said external ground plane.

14. A ground system according to claim 12, further comprising a plurality of further ground pins disposed adjacent to and substantially surrounding each of said signal pins in the space between said internal ground plane and said probe plate.

15. A ground system according to claim 11, wherein the electrical connection between the internal conductors of said coax assemblies and said signal pins comprise signal wires disposed adjacent to but spaced apart from the conductive surface of said internal ground plane.

16. A ground system according to claim 15, wherein said signal wires are spaced apart from the conductive surface of said internal ground plane by not more than about ½ wire diameter to provide strip line impedance for the signal wires.

17. A ground system according to claim 11, wherein said alignment plate comprises an internal non-conductive support having an external conductive metal surface coating thereon to permit conduction of the ground signal between the test board system and said coax assembly.

18. A ground system according to claim 11, wherein said alignment plate comprises an internal non-conductive support having a ground comb fixed thereon to permit conduction of the ground signal between the test board system and said coax assembly.

19. A ground system according to claim 11, wherein said coax assemblies each comprise a conductive cylinder-like sleeve having a narrow part and a wide part, a conductive ring placed over said narrow part, a plastic cylinder-like insulator concentrically surrounding said internal conductor, and a spring disposed between said ring and said wide part for forcing said sleeve to contact the conductive surface of said internal ground plane and said ring to contact the conductive surface of said alignment means.

20. A ground system according to claim 19, wherein said wide part contains an opening to provide a path for the electrical connection between the internal conductor of that coax assembly and the corresponding signal pin.

* * * * *